United States Patent
Frederick (10) Patent No.: US 8,051,401 B2
(45) Date of Patent: Nov. 1, 2011

(54) POST-ROUTING POWER SUPPLY MODIFICATION FOR AN INTEGRATED CIRCUIT

(75) Inventor: Marlin Wayne Frederick, Austin, TX (US)

(73) Assignee: ARM Limited, Cambridge (GB)

( * ) Notice: Subject to any disclaimer, the term of this patent is extended or adjusted under 35 U.S.C. 154(b) by 480 days.

(21) Appl. No.: 12/285,889

(22) Filed: Oct. 15, 2008

(65) Prior Publication Data

US 2010/0095263 A1 Apr. 15, 2010

(51) Int. Cl.
*G06F 17/50* (2006.01)

(52) U.S. Cl. ......... 716/129; 716/126; 716/130; 716/133

(58) Field of Classification Search .................. 716/126, 716/130, 132, 133, 122, 129
See application file for complete search history.

(56) References Cited

U.S. PATENT DOCUMENTS

| | | | | |
|---|---|---|---|---|
| 5,537,328 A * | 7/1996 | Ito | | 716/120 |
| 5,932,900 A * | 8/1999 | Lin et al. | | 257/204 |
| 6,297,668 B1 * | 10/2001 | Schober | | 326/101 |
| 7,007,257 B2 * | 2/2006 | Tanaka | | 716/113 |
| 7,069,522 B1 * | 6/2006 | Sluss et al. | | 716/114 |
| 7,190,187 B2 * | 3/2007 | Hua et al. | | 326/27 |
| 7,219,324 B1 * | 5/2007 | Sherlekar et al. | | 257/207 |
| 7,349,223 B2 * | 3/2008 | Haemer et al. | | 361/767 |
| 7,603,634 B2 * | 10/2009 | Sluss et al. | | 716/138 |
| 2007/0180419 A1 * | 8/2007 | Sherlekar et al. | | 716/9 |

* cited by examiner

*Primary Examiner* — Sun Lin
(74) *Attorney, Agent, or Firm* — Nixon & Vanderhye P.C.

(57) ABSTRACT

A technique for generating a layout of an integrated circuit places standard cells in position and provides power rail conductors formed in a second metal layer overlying power connection conductors formed in a first metal layer via which the power is supplied to the standard cells. Routing connection conductors are added in the first metal layer and are permitted to pass through gaps between the power connection conductors of the first metal layer and underneath the power rail conductors of the second metal layer. Once routing has been performed, gaps between the power connection conductors of the first metal layer underlying the power rail conductors and not being used by routing connection conductors are closed so as form interrupted power rail conductors within the first meal layer.

16 Claims, 5 Drawing Sheets

POST-ROUTING POWER SUPPLY MODIFICATION FOR AN INTEGRATED CIRCUIT

BACKGROUND OF THE INVENTION

1. Field of the Invention

This invention relates to the field of integrated circuits. More particularly, this invention relates to the generation of layouts for integrated circuits including the layouts for the power supply within those integrated circuits.

2. Description of the Prior Art

It is known to provide mechanisms, such as appropriately programmed general purpose computers, that generate layouts for integrated circuits using libraries of standard cell designs and data defining the functionality and/or the circuits to be provided. This process is termed synthesis. One stage in the synthesis process is placing the standard cells at appropriate positions within the integrated circuit so that they are relatively nearby the other standard cells with which they need to communicate. A routing step then generates the conductors to route signals between the standard circuit cells which have been placed. Metal layers, such as the first metal layer, are normally used for such signal routing. Placement and signal routing are facilitated when there is a high degree of flexibility in the routing which may be provided, i.e. routing hotspots may be reduced and signal paths may be shortened.

Another part of the generation of layouts for an integrated circuit is the provision of the power supply for the circuitry formed from the standard cells. The power supply is typically provided by running power rail conductors across the integrated circuit at a regular spacing and parallel to one another. The standard cells are then be linked to these power supply rails so as to draw electrical energy therefrom. One known technique is to use a second metal layer to provide power rail conductors running across the integrated circuit. Power connection conductors positioned at least partially overlaid by the power rail conductors and provided within a first metal layer are used to connect the power rail conductors to appropriate points within the standard cells using connection vias. Providing the power connection conductors in the first metal layer in combination with the power rail conductors of the second metal layer enables gaps to be provided between the power connection conductors within the first metal layer thereby allowing signal routing conductors within the first metal layer to pass beneath the power rail conductors and provide signal porosity via the first metal layer in a direction perpendicular to the power rail conductors. This ability to provide routing conductors running under the power rail conductors helps reduce routing hotspots and enables more efficient placement.

A problem with the above use of power connection conductors within the first metal layer to link power from the power rail conductors to the circuits of the standard cells is that the via connections between the power rail conductor and the power connection conductor are a potential source of manufacturing errors which can disadvantageously reduce the manufacturing yield. If the via connections between the power rail conductor within the second metal layer and the power connection conductor within the first metal layer are not properly formed, then the power supply to an associated standard cell will not operate correctly leading to a failure of the integrated circuit. As integrated circuits increase in complexity and have increased numbers of standard cells therein, there is an increased likelihood of an error occurring in the via connections between the power rail conductors and the power connection conductors resulting in a failed component.

SUMMARY OF THE INVENTION

Viewed from one aspect, the present invention provides a method of generating a layout for an integrated circuit having at least a substrate upon which a plurality of gates are formed, a first metal layer overlying said substrate and a second metal layer overlying said first metal layer, said method comprising the steps of: selecting a placement upon said integrated circuit of a plurality of power connection conductors to be formed as part of said first metal layer, a plurality of routing connection conductors to be formed as part of said first metal layer and a plurality of power rail conductors to be formed as part of said second metal layer, such that: (i) said plurality of power rail conductors are disposed substantially parallel to one another across said integrated circuit; (ii) said plurality of power connection conductors are disposed at positions at least partially overlaid by said power rail conductors and providing power connections between said power rail conductors and said gates, said power connection conductors overlaid by at least one power rail conductor having a plurality of gaps therebetween in said first metal layer; and (iii) at least one of said plurality of routing connections conductors runs through one of said plurality of gaps; and extending said power connection conductors disposed at least partially overlaid by said at least one power rail conductor so as to close at least one of said plurality gaps not having a routing connection running therethrough.

The present technique recognises that the advantages of providing for routing conductors to pass through the gaps between the power connection conductors so as to cross beneath power rail conductors can be maintained (thereby maintaining the advantages associated with such porosity), and the reliability of the integrated circuit can be improved, if after the routing connection conductors have been placed passing through gaps between the power connection conductors, remaining gaps which do not have a routing conductor passing therethrough between power connection conductors are closed by metal of the first metal layer thereby linking together what would otherwise be separate power connection conductors. In this way an increased level of redundancy can be provided between the vias making connections from the power rail conductor to the underlying power connection conductors. If a via connecting to an individual power connection conductors is not properly formed but that power connection conductor is now linked to another power connection conductor by having the gap therebetween closed within the first metal layer after signal routing (as the gap is not needed), then the via connection to that other power connection conductor will provide a backup to the failed via connection and accordingly enable the integrated circuit to continue to function despite what could previously have potentially been a serious flaw. This improves manufacturing yield. Furthermore, even in situations where via failures do not arise, the increased number of connections between the power rail conductors and the power connection conductors reduces the amount of resistive loss within the power supply thereby reducing voltage sagging and other disadvantages associated with such resistive loss. It will be appreciated that routing connection conductors may also be partially or wholly provided in other metal layers. It will be appreciated that in practice the power connection conductors may form part of standard cells that are being placed and so the placement of the standard cells will in this case serve to place the power connection conductors rather than the power connection conductors being separately placed. All of these variations are encompassed by the present techniques in which either directly or indirectly the various elements discussed above are placed.

It will be appreciated that the routing conductors can cross under the power rail conductors in a variety of orientations. However, it is most practical if the routing conductors run substantially perpendicular to the power rail conductors through the gaps. This enables smaller gaps to be exploited.

Whilst it would be possible to only close some of the gaps which are not being used for routing after placement and routing, an increased level of advantage is achieved when substantially all (e.g. an overwhelming majority) of these unused gaps are closed after signal routing has been performed.

It will be appreciated that the power connection conductors could be connected to the overlying power rail conductors in different ways. However, the technique is well suited to embodiments in which these connections are made using vias.

When the gaps which are unused for routing are closed between the power connection conductors underlying a power rail conductor, the resulting structure within the first metal layer can be considered to form an interrupted power rail conductor within the first metal layer. The relationship between this interrupted power rail conductor and the overlying power rail conductor can take a variety of different forms.

In some embodiments the power rail conductor may be a single track conductor overlying a single track interrupted power rail conductor. In other embodiments the power rail conductor may be a double track conductor and the underlying interrupted power rail conductor may be a single track conductor.

In still further embodiments the power rail conductor may be a double track conductor and the interrupted power rail conductor may be a double track conductor, i.e. consume two track widths of resource. In this type of embodiment the interrupted power rail conductor may be thinned to a single track conductor at some positions along its length so as to maintain a minimum spacing from another conductor formed in the first metal layer adjacent to the interrupted power rail and not passing through a gap in the interrupted power rail. It is also possible for the power rail conductors to be wider than double tracks.

Viewed from another aspect, the present invention provides an integrated circuit comprising: a substrate upon which a plurality of gates are formed; a first metal layer overlying said substrate; and a second metal layer overlying said first metal layer, wherein a plurality of power connection conductors are formed as part of said first metal layer, a plurality of routing connection conductors are formed as part of said first metal layer and a plurality of power rail conductors are formed as part of said second metal layer, such that: (i) said plurality of power rail conductors are disposed substantially parallel to one another across said integrated circuit; (ii) said plurality of power connection conductors are disposed at positions at least partially overlaid by said power rail conductors and providing power connections between said power rail conductors and said gates, said power connection conductors overlaid by at least one power rail conductor having one or more gaps therebetween in said first metal layer; and (iii) at least one of said plurality of routing connection conductors runs through each of said one or more gaps.

Embodiments of the invention will now be described, by way of example only, with reference to the accompanying drawings, in which.

BRIEF DESCRIPTION OF THE DRAWINGS

DESCRIPTION OF THE PREFERRED EMBODIMENTS

Figure 1:
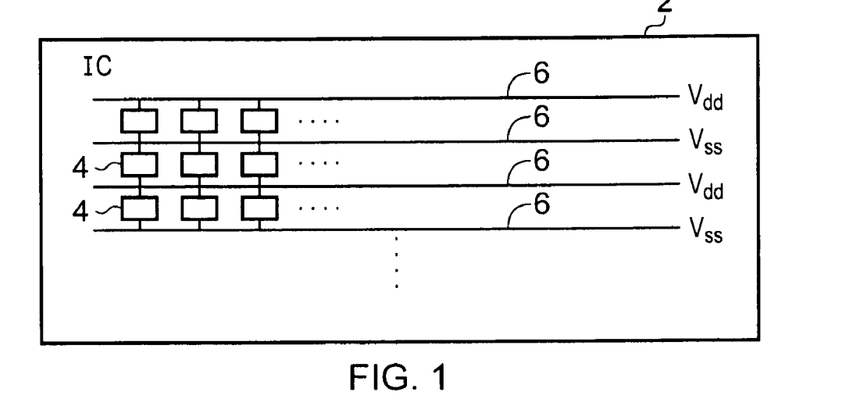
FIG. 1 schematically illustrates an integrated circuit including a plurality of standard cells coupled to respective power rail conductors running across the integrate circuit.

FIG. 1 schematically illustrates an integrated circuit 2 formed of a plurality of standard cells 4 supplied with electrical energy via power rail conductors 6 running across the integrated circuit 2 parallel to one another. This type of power grid arrangement will be familiar to those in this technical field. Other types of power grid are also possible and are encompassed within the present technique.

Figure 2:
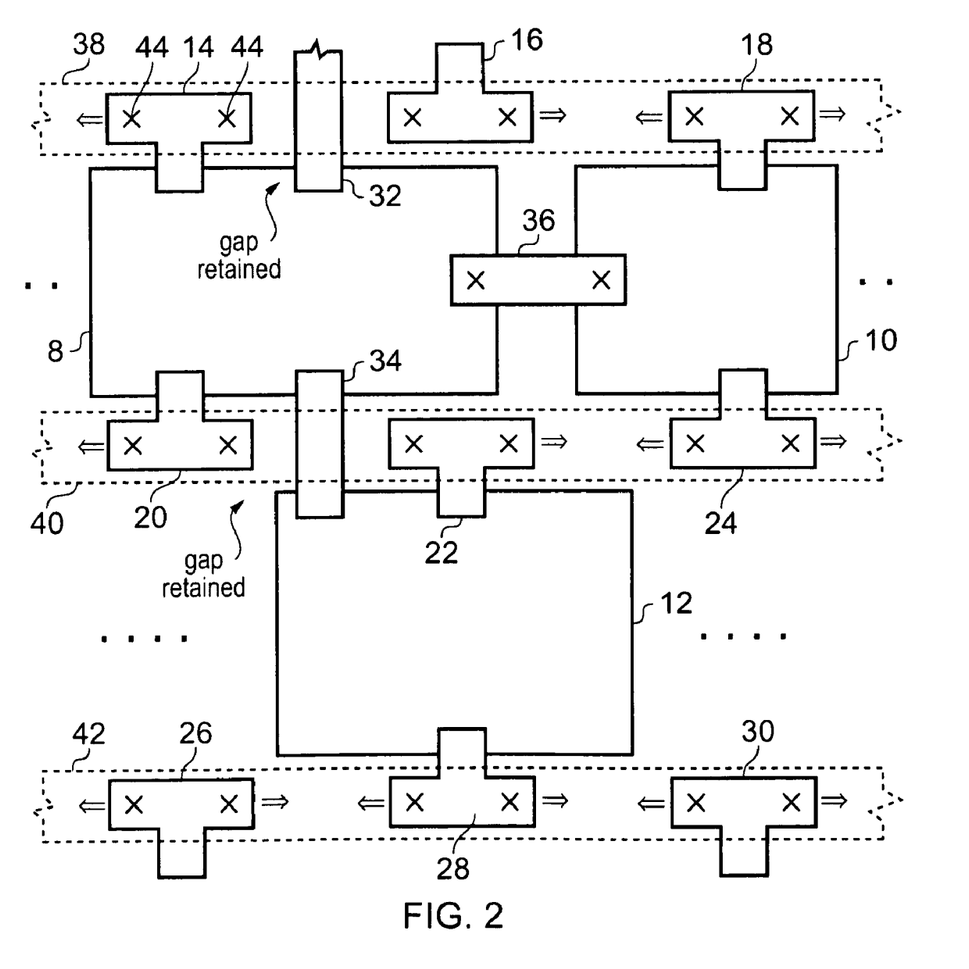
FIG. 2 illustrates in more detail the relationship between power rail conductors, power connection conductors, routing conductors and the circuitry of the standard cells at the time at which signal routing has been performed.

FIG. 2 illustrates a portion of the integrated circuit 2 of FIG. 1 in more detail after the step of placing the standard circuit cells 8, 10, 12 has been performed. The standard cells 8, 10, 12 also include the power connection conductors 14, 16, 18, 20, 22, 24, 26, 28, 30 formed (or to be formed) in a first metal layer. The power connection conductors 14 to 30 provide electrical connectivity (such as by contact) with the standard circuit cells and the gates therein. Routing conductors 32, 34 and 36 are provided for routing signals between standard circuit cells 8, 10, 12. These routing conductors 32, 34, 36 are also formed in the first metal layer. Over the first metal layer, and separate therefrom by an appropriate insulator, there are formed (or will be formed) power rail conductors 38, 40, 42 as part of a second metal layer. The standard cells 8, 10, 12 (which contain the circuit gates) as well as the other structures illustrated in FIG. 2 are formed on top of an underlying substrate.

It will be appreciated that the arrangement illustrated in FIG. 2 following the initial placement and routing steps is still a design for the layout of an integrated circuit and has not at this point been produced in physical form. It will be further appreciated by those in this technical field that this type of generation of layout for an integrated circuit is part of the synthesis of an integrated circuit design and is typically performed by computer software executing on a general purpose computer. Computer software tools for performing such layout generation (i.e. electronic design automation (EDA) tools) are provided by companies such as Cadence Design Systems, Inc and Synopsis Inc as well as other companies. These known programs may be used to provide the general placement, routing and other layout generation steps conventionally performed as part of generating a layout for an integrated circuit as will be familiar to those in this technical field. Where this process has been modified in accordance with the present techniques is described below.

As illustrated in FIG. 2, the routing conductors 32 and 34 pass substantially perpendicularly underneath the power rail conductors 38 and 40 respectively. The gaps between the power connection conductors 14 and 16 and between the power connection conductors 20 and 22 are exploited to allow these routing conductors 32 and 34 to route in the manner shown. This porosity to signal routing perpendicular to the power rails 38, 40, 42 provided by the gaps between the power connection conductors 14 to 30 is advantageous in improving the freedom with which standard circuit cells may be placed and helps the routing be arranged so as to avoid problems such as local routing hotspots.

If the layout generating process finished with the layout illustrated in FIG. 2, at least in respect of the aspects discussed above, it will be seen that the individual power connection conductors 14 to 30 have relatively few via conductors 44 linking them to their overlying power rail conductors 38, 40, 42. Accordingly, should these via conductors for some reason be ineffective, the power supply may not be properly provided to one of the standard cells 8, 10, 12. This can lead to a defective integrated circuit 2. When there are many millions, or even billions, of standard cells 8, 10, 12 and their associated power connection conductors 14 to 30 within an integrated circuit 2, the statistical likelihood of one or more power connection conductors being isolated from the overlying power rail conductor 38, 40, 42 becomes significant and disadvantageously reduces yield.

Figure 3:
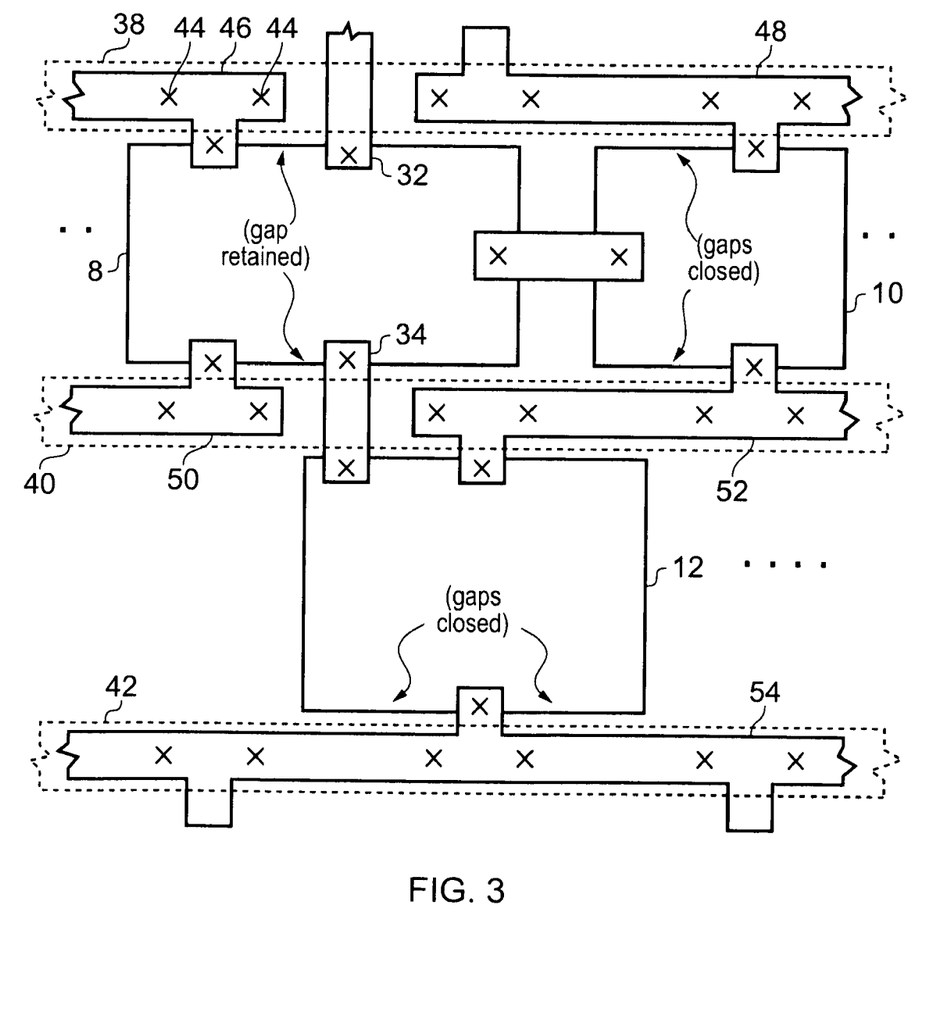
FIG. 3 illustrates the arrangement of FIG. 2 after the step of closing gaps between the power connection conductors which are not being used for signal routing.

In order to address this problem, subsequent to the layout design reaching the form illustrated in FIG. 2, there is performed a further step as illustrated in FIG. 3 and as illustrated by the arrows in FIG. 2. This further step is to close the gaps between the power connection conductors 14 to 30 which are not being used by routing conductors 32, 34. Gaps which are being used and through which routing conductors 32, 34 pass are retained within the layout. The closing of the gaps between the power connection conductors 14 to 30 by extending them within the first metal layer under the power rail conductors 38, 40, 42 generates what can be considered to be interrupted power rail conductors 46, 48, 50, 52, 54 within the first metal layer. These interrupted power rail conductors 46, 48, 50, 52 and 54 have a larger number of via conductors 44 linking them to the respective overlying power rail conductors 38, 40, 42 within the second metal layer thereby providing increased redundancy in respect of the via conductors 44 and accordingly a higher production yield. Furthermore, the increased number of connections also reduces resistive losses with associated advantages.

In accordance with the present technique, the advantages of porosity within the first metal layer in a direction perpendicular to the power rail conductors 38, 40, 42 in the second metal layer is maintained while the exposure to failure to make proper electrical contact between the power rail conductors 38, 40, 42 and the underlying power connection conductors 14 to 30 is reduced.

It will be appreciated that in practice it will be the layout of FIG. 3 which is eventually manufactured and instantiated as an integrated circuit. The layout of FIG. 2 is an intermediate layout design generated by the software tools, but not manufactured.

In the above reference has been made to the first metal layer and the second metal layer. It will be appreciated that the use of the terms first and second is intended to indicate the relative ordering of these two individual layers and in practice these layers need not necessarily be adjacent and need not necessarily be the layers closest to the underlying substrate. However, the invention is of particular use when these layers are the metal one layer and the metal two layer within an integrated circuit.

Figure 4A:
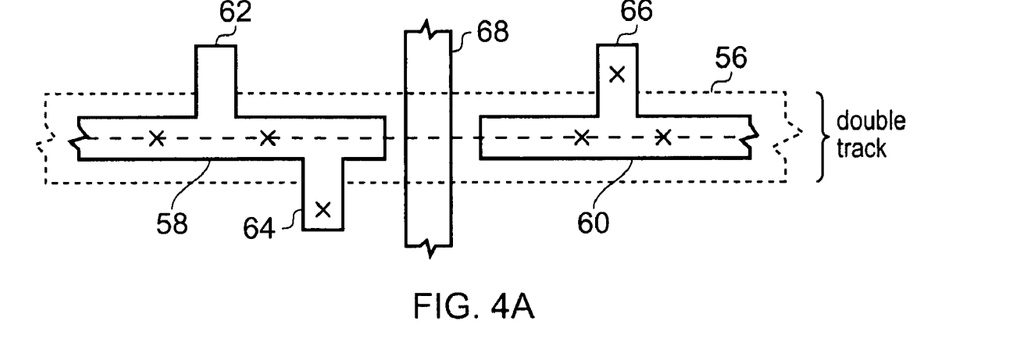
FIGS. 4A and 4B illustrate two example forms of the interrupted power rail formed after unused gap closing within the first metal layer under the power rail conductor of the second metal layer.

FIG. 4A schematically illustrates one example form of the relationship between a power rail conductor 56 formed in the second metal layer and interrupted power rail conductors 58, 60 formed in the first metal layer (this being illustrated in the form after unused gaps have been closed in a post routing step). In this example the power rail conductor 56 is two tracks wide (i.e. consumes two track widths of routing resource and may in practice be more than double the width of a rail consuming one track width of routing resource) while the interrupted power rail conductors 58, 60 are a single track wide along their major axis and have stubs 62, 64 and 66 extending out to make electrical connections to associated standard cells 8, 10, 12. In the example illustrated in FIG. 4A a routing conductor 68 passes through a gap between the interrupted power rail conductors 58, 60 and beneath the power rail conductor 56 so as to provide routing signal porosity perpendicular to the power rail conductor 56. The interrupted power rail conductors 58, 60 are shown disposed in the centre beneath the power rail conductor 56, although in practice there may be an offset.

Figure 4B:
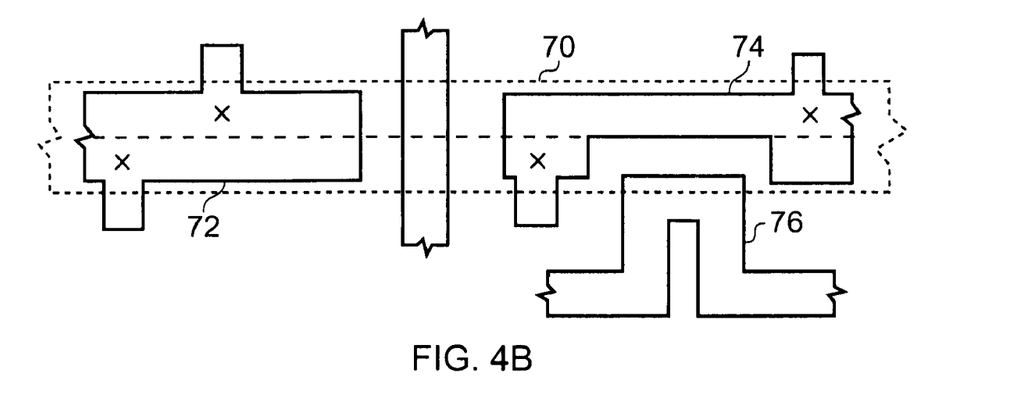

FIG. 4B illustrates another example relationship between a power rail conductor 70 of the second metal layer and interrupted power rail conductors 72, 74 of the first metal layer (this being illustrated in the form after unused gaps have been closed in a post routing step). In this example the power rail conductor 70 is two tracks in width and the interrupted power rail conductors 72, 74 are where possible also two tracks in width (i.e. the rails are at least twice the minimum width which allows them to be of a legal width except where the interrupted power rail is thinned to avoid proximity to another metal structure). It will be seen in example of FIG. 4B that within the standard circuit cell adjacent the interrupted power rail conductor 74 there is provided within the first metal layer another conductor 76 which runs in close proximity to the interrupted power rail conductor 74. In order to maintain a minimum spacing between the interrupted power rail conductor 74 and the another conductor 76, the interrupted power rail conductor 74 is thinned along the portion adjacent the another conductor 76. This does not compromise electrical continuity and does not significantly reduce the redundancy of the via conductor connections, but permits closer routing of first metal layer conductors within the standard cells to the interrupted power rail conductors 72, 74 in a manner which permits reduced circuit cell size.

Figure 5:
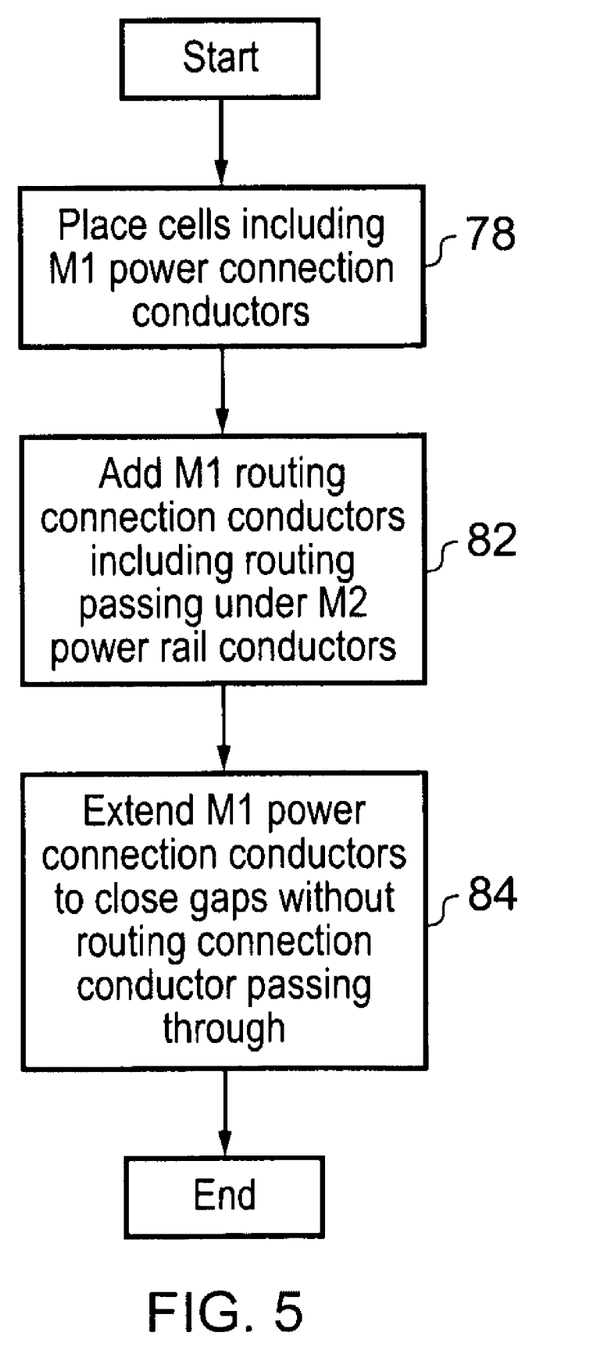
FIG. 5 is a flow diagram illustrating the process of placing the power rail conductors, power connection conductors, routing conductors and standard cells followed by the closing of the gaps between the power connection conductors within the first metal layer.

FIG. 5 schematically illustrates the placement, routing and extending processes of the present technique. At step 78, the standard circuit cells are placed in their candidate positions within the integrated circuit 2 and include their the metal one power connection conductors to provide electrical power to the standard cells. These power connection conductors have gaps between them to allow porosity to routing signals within the first metal layer underneath the power rail conductors which will overly the power connection conductors.

At step 82, the first metal layer routing connection conductors are added as required to provide signal routing between the standard cells including in a direction passing under the second metal layer power rail conductors.

At step 84, subsequent to the signal routing step, the power connection conductors within the first metal layer are extended (under the power rail conductors) so as to close gaps therebetween when those gaps do not have routing connection conductors passing through them. Gaps which do have a routing connection conductor passing through them are not closed. In this way, previously separate power connection conductors are joined together in a manner which enhances their resistance to via conductor misformation and also improves their electrical properties.

Figure 6:
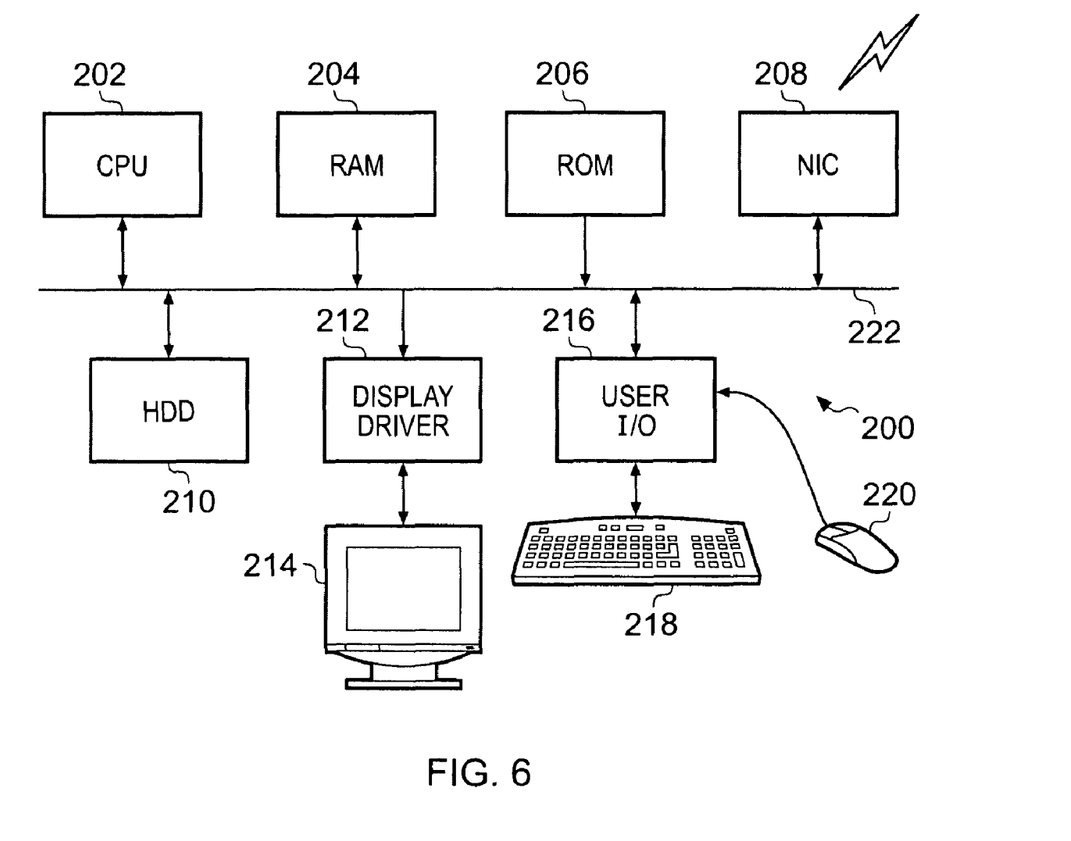
FIG. 6 schematically illustrates a general purpose computer of the type which may be used implement the above mentioned techniques for generating the layout of an integrated circuitry in accordance with the techniques described herein.

FIG. 6 schematically illustrates a general purpose computer 200 of the type that may be used to implement the above described techniques and in particular the programming of watchpoint or watch ranges with their ordering characteristics. The general purpose computer 200 includes a central processing unit 202, a random access memory 204, a read only memory 206, a network interface card 208, a hard disk drive 210, a display driver 212 and monitor 214 and a user input/output circuit 216 with a keyboard 218 and mouse 220 all connected via a common bus 222. In operation the central processing unit 202 will execute computer program instructions that may be stored in one or more of the random access memory 204, the read only memory 206 and the hard disk drive 210 or dynamically downloaded via the network interface card 208. The results of the processing performed may be displayed to a user via the display driver 212 and the monitor 214. User inputs for controlling the operation of the general purpose computer 200 may be received via the user input output circuit 216 from the keyboard 218 or the mouse 220. It will be appreciated that the computer program could be written in a variety of different computer languages. The computer program may be stored and distributed on a recording medium or dynamically downloaded to the general purpose computer 200. When operating under control of an appropriate computer program, the general purpose computer 200 can perform the above described techniques and can be considered to form an apparatus for performing the above described technique. The architecture of the general purpose computer 200 could vary considerably and FIG. 6 is only one example.

Many modifications to the above described examples are possible while remaining part of the present technique. For example, a power rail in the first metal layer may be drawn with first metal layer pseudo shapes that short together the power connection conductors. The routing algorithm may be programmed to ignore these pseudo shapes while routing, i.e. consider them as not closing the gaps between the power connection conductors. Then, after routing, by way of adding first metal layer rail shapes, the system can promote the first metal layer psuedo shapes to first metal layer shapes if the first metal layer psuedo shapes don't intersect any routing connection conductors. In this variation, the pseudo shapes still leave gaps between the power connection conductors since routing takes place through these gaps as the pseudo shapes are not treated as closing the gaps. Furthermore, the promoting of the pseudo shapes that do not intersect routing connection conductors to be first metal layer shapes that will be formed serves to extend the power connection conductors in the manner previously discussed.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A method of generating a layout for an integrated circuit having at least a substrate upon which a plurality of gates are formed, a first metal layer overlying said substrate and a second metal layer overlying said first metal layer, said method comprising the steps of:

selecting a placement upon said integrated circuit of a plurality of power connection conductors to be formed as part of said first metal layer, a plurality of routing connection conductors to be formed as part of said first metal layer and a plurality of power rail conductors to be formed as part of said second metal layer, such that:
   (i) said plurality of power rail conductors are disposed substantially parallel to one another across said integrated circuit;
   (ii) said plurality of power connection conductors are disposed at positions at least partially overlaid by said power rail conductors and providing power connections between said power rail conductors and said gates, said power connection conductors overlaid by at least one power rail conductor having a plurality of gaps therebetween in said first metal layer; and
   (iii) at least one of said plurality of routing connection conductors runs through one of said plurality of gaps; and
extending said power connection conductors disposed at least partially overlaid by said at least one power rail conductor so as to close at least one of said plurality gaps not having a routing connection conductor running therethrough, said steps implemented on a general purpose computer.

2. A method as claimed in claim 1, wherein said at least one of said plurality routing connection conductors runs substantially perpendicular to said at least one power rail conductor through said one of said plurality of gaps.

3. A method as claimed in claim 1, wherein substantially all of said plurality of gaps not having a routing connection conductor running therethrough are closed by extending said power connection conductors.

4. A method as claimed in claim 1, wherein said power connection conductors are electrically connected to overlying power rail conductors by via conductors.

5. A method as claimed in claim 1, wherein said step of extending provides an interrupted power rail conductor to be formed in said first metal layer and overlaid by said at least one power rail conductor, said interrupted power rail conductor having at least one gap therein having a routing connection conductor running therethrough.

6. A method as claimed in claim 5, wherein said at least one power rail conductor is a single track conductor overlying said interrupted power rail conductor.

7. A method as claimed in claim 5, wherein said interrupted power rail conductor is a single track conductor and said at least one power rail conductor is a double track conductor overlying said interrupted power rail conductor.

8. A method as claimed in claim 5, wherein said interrupted power rail conductor is a double track conductor and said at least one power rail conductor is a double track conductor overlying said interrupted power rail conductor.

9. A method as claimed in claim 8, wherein said interrupted power rail conductor is thinned to a single track conductor at one or more positions so as to maintain a minimum spacing from another conductor formed in said first metal layer adjacent said interrupted power rail conductor and not passing through a gap therein.

10. An integrated circuit comprising:
a substrate upon which a plurality of gates are formed;
a first metal layer overlying said substrate; and
a second metal layer overlying said first metal layer, wherein
a plurality of power connection conductors are formed as part of said first metal layer, a plurality of routing connection conductors are formed as part of said first metal layer and a plurality of power rail conductors are formed as part of said second metal layer, wherein:
  (i) said plurality of power rail conductors are disposed substantially parallel to one another across said integrated circuit;
  (ii) said plurality of power connection conductors are disposed at positions at least partially overlaid by said power rail conductors and providing power connections between said power rail conductors and said gates, said power connection conductors overlaid by at least one power rail conductor having one or more gaps therebetween in said first metal layer; and
  (iii) at least one of said plurality of routing connection conductors runs through one of said one or more gaps, wherein said power connection conductors extend in said first metal layer to provide an interrupted power rail conductor formed in said first metal layer and overlaid by said at least one power rail conductor, said interrupted power rail conductor having at least one gap therein having a routing connection conductor running therethrough.

11. An integrated circuit as claimed in claim 10, wherein said at least one of said plurality routing connection conductors runs substantially perpendicular to said at least one power rail conductor through said one or more gaps.

12. An integrated circuit as claimed in claim 10, wherein said power connection conductors are electrically connected to overlying power rail conductors by via conductors.

13. An integrated circuit as claimed in claim 10, wherein said at least one power rail conductor is a single track conductor overlying said interrupted power rail conductor.

14. An integrated circuit as claimed in claim 10, wherein said interrupted power rail conductor is a single track conductor and said at least one power rail conductor is a double track conductor overlying said interrupted power rail conductor.

15. An integrated circuit as claimed in claim 10, wherein said interrupted power rail conductor is a double track conductor and said at least one power rail conductor is a double track conductor overlying said interrupted power rail conductor.

16. An integrated circuit as claimed in claim 15, wherein said interrupted power rail conductor is thinned to a single track conductor at one or more positions so as to maintain a minimum spacing from another conductor formed in said first metal layer adjacent said interrupted power rail conductor and not passing through a gap therein.

* * * * *